United States Patent
Fujioka et al.

[11] Patent Number: 5,968,274
[45] Date of Patent: *Oct. 19, 1999

[54] CONTINUOUS FORMING METHOD FOR FUNCTIONAL DEPOSITED FILMS AND DEPOSITION APPARATUS

[75] Inventors: Yasushi Fujioka; Shotaro Okabe, both of Nara; Masahiro Kanai, Soraku-gun; Takehito Yoshino, Nara; Akira Sakai; Tadashi Hori, both of Soraku-gun, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/754,066

[22] Filed: Nov. 20, 1996

Related U.S. Application Data

[60] Continuation of application No. 08/404,616, Mar. 15, 1995, abandoned, which is a division of application No. 08/101,018, Aug. 3, 1993, abandoned.

[30] Foreign Application Priority Data

Aug. 6, 1992 [JP] Japan ..................................... 4-231314

[51] Int. Cl.$^6$ ............................. C23C 16/54; C23C 14/56
[52] U.S. Cl. .................. 118/718; 118/719; 118/723 MP; 118/723 MW; 118/723 E; 204/298.24; 204/298.25
[58] Field of Search ..................... 118/718–719, 723 MP, 118/723 MW, 723 E; 204/298.24, 298.25; 136/258 AM; 437/4, 101, 113; 427/563, 568–569, 575, 578; 438/482, 485, 488, 490

[56] References Cited

U.S. PATENT DOCUMENTS

| | | | |
|---|---|---|---|
| 4,438,723 | 3/1984 | Cannella et al. | 118/718 |
| 4,462,332 | 7/1984 | Nath et al. | 118/718 |
| 4,480,585 | 11/1984 | Gattuso | 118/719 |
| 4,485,125 | 11/1984 | Izu et al. | 427/74 |
| 4,519,339 | 5/1985 | Izu et al. | 118/718 |
| 4,677,738 | 7/1987 | Izu et al. | 437/2 |
| 4,717,586 | 1/1988 | Ishihara et al. | 427/568 |
| 4,728,528 | 3/1988 | Ishihara et al. | 427/568 |
| 4,771,015 | 9/1988 | Kanai et al. | 437/109 |

(List continued on next page.)

FOREIGN PATENT DOCUMENTS

| | | | |
|---|---|---|---|
| 62-36633 | 8/1987 | Japan | H01L 21/205 |
| 3-30419 | 2/1991 | Japan | H01L 21/205 |

*Primary Examiner*—Nam Nguyen
*Assistant Examiner*—Rodney G. McDonald
*Attorney, Agent, or Firm*—Fitzpatrick, Cella, Harper & Scinto

[57] ABSTRACT

The present invention aims to provide a continuous forming method and apparatus for functional deposited films having excellent characteristics while preventing any mutual mixture of gases between film forming chambers having different pressures, wherein semiconductor layers of desired conductivity type are deposited on a strip-like substrate within a plurality of film forming chambers, by plasma CVD, while the strip-like substrate is moved continuously in a longitudinal direction thereof through the plurality of film forming chambers connected via gas gates having means for introducing a scavenging gas into a slit-like separation passage, characterized in that at least one of the gas gates connecting the i-type layer film forming chamber for forming the semiconductor junction and the n- or p-type layer film forming chamber having higher pressure than the i-type layer film forming chamber has the scavenging gas introducing position disposed on the n- or p-type layer film forming chamber side off from the center of the separation chamber of the gas gate.

15 Claims, 10 Drawing Sheets

U.S. PATENT DOCUMENTS

| | | | |
|---|---|---|---|
| 4,772,486 | 9/1988 | Ishihara et al. | 427/561 |
| 4,772,570 | 9/1988 | Kanai et al. | 437/109 |
| 4,778,692 | 10/1988 | Ishihara et al. | 427/568 |
| 4,784,874 | 11/1988 | Ishihara et al. | 427/568 |
| 4,801,468 | 1/1989 | Ishihara et al. | 427/563 |
| 4,818,563 | 4/1989 | Ishihara et al. | 427/568 |
| 4,830,890 | 5/1989 | Kanai | 427/255.1 |
| 4,842,897 | 6/1989 | Takeuchi et al. | 427/255.2 |
| 4,851,302 | 7/1989 | Nakagawa et al. | 428/658 |
| 4,853,251 | 8/1989 | Ishihara et al. | 427/563 |
| 4,873,125 | 10/1989 | Matsuyama et al. | 427/248.1 |
| 4,913,928 | 4/1990 | Sugita et al. | 427/571 |
| 4,951,602 | 8/1990 | Kanai | 118/719 |
| 4,971,832 | 11/1990 | Arai et al. | 427/575 |
| 5,266,116 | 11/1993 | Fujioka et al. | 118/718 |
| 5,382,531 | 1/1995 | Yasushi et al. | 437/2 |

F I G. 5
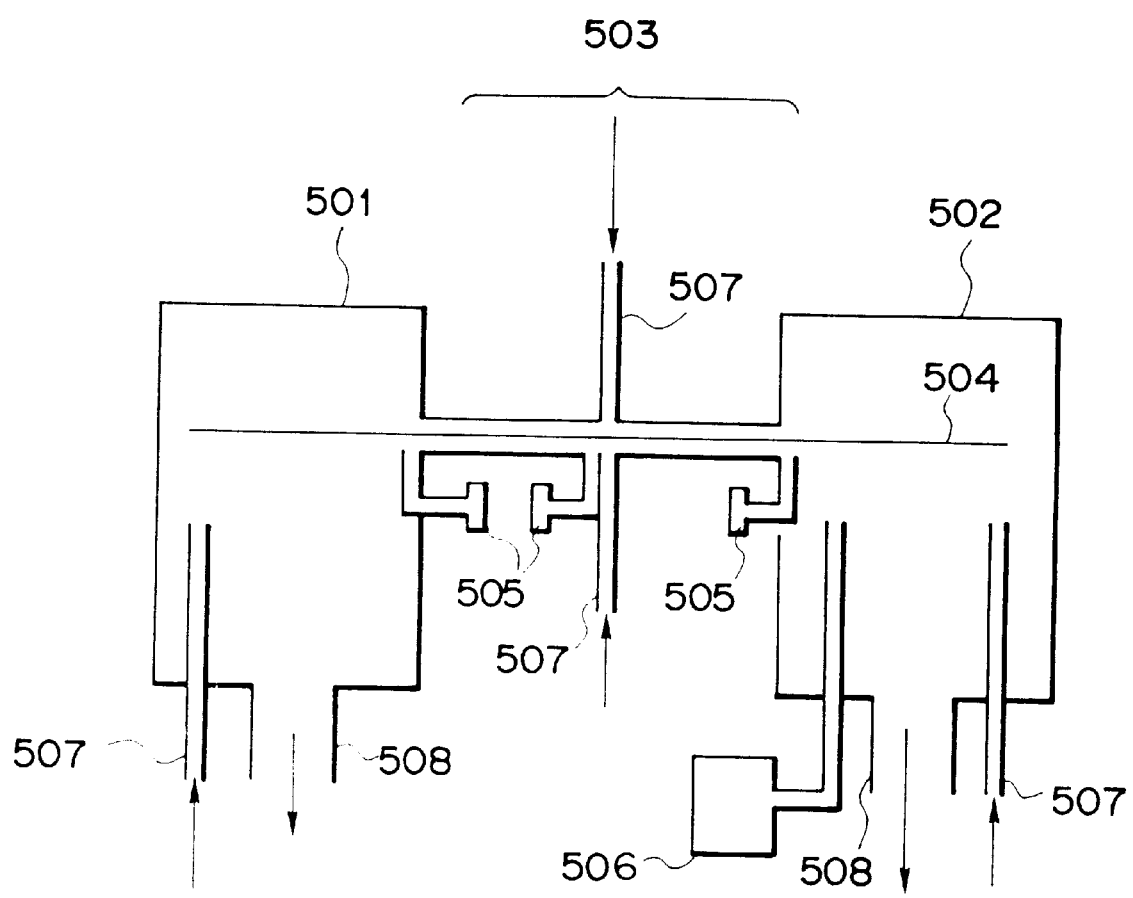

CONTINUOUS FORMING METHOD FOR FUNCTIONAL DEPOSITED FILMS AND DEPOSITION APPARATUS

This application is a continuation of application Ser. No. 08/404,616 filed Mar. 15, 1995, now abandoned, which is a division of application Ser. No. 08/101,018 filed Aug. 3, 1993, now abandoned.

BACKGROUND OF THE INVENTION

1. Field of the Invention

The present invention relates to a method for continuously forming functional deposited films such as for a photovoltaic element and a deposition apparatus, and more particularly to a method for continuously forming functional deposited films such as for a large area photovoltaic element on a substrate and a deposition apparatus.

2. Related Background Art

Conventionally, deposited film forming apparatuses of three chamber separation type have been well known in which functional deposited films such as for a photovoltaic element are formed on a substrate by passing them consecutively through film forming chambers completely separated by a gate valve to form a semiconductor in order to improve the characteristics of the semiconductor. These film forming chambers completely separated were superior in the respect of preventing contamination with impurities but resulted in less productivity. Therefore, to form a semiconductor device such as a photovoltaic element on a strip-like substrate, a continuous film forming apparatus for continuously forming predetermined functional deposited films has been proposed in which the strip-like substrate is continuously conveyed from a strip-like substrate container to a plurality of reaction chambers in each of which a predetermined semiconductor film is formed thereon, and then received within another strip-like substrate container.

In Japanese Patent Application No. 62-36633, for example, a continuous plasma CVD method adopting the roll-to-roll method has been disclosed. According to this method, a photovoltaic element having semiconductor junctions can be continuously formed in which a plurality of glow discharge regions are provided, a longitudinally extending strip-like substrate of desired width is arranged along a passage passing through the plurality of glow discharge regions in sequence, and then a semiconductor of a desired conductivity type is deposited in each glow discharge region while the substrate is continuously conveyed in its longitudinal direction. In this Japanese Patent Publication, a gas gate is used for preventing the diffusion or contamination of impurity gases for the formation of a doped semiconductor layer into other glow discharge regions. Specifically, the plurality of glow discharge regions as above described are separated by a slit-like separation passage, and means is further provided for forming a flow of a scavenging gas such as Ar or $H_2$ in the separation passage.

In this case, however, when a pressure difference is present from one film forming chamber to another in the gas gate, the problem arises that a film forming gas is prone to migrate from a higher pressure film forming chamber to a lower pressure film forming chamber.

To counter this problem, a conventionally adopted solution was such that the adjacent film forming chambers were equalized in pressure to eliminate such pressure difference, or the film forming chamber was placed at higher pressure to prevent the inflow of a gas from the adjacent film forming chamber, as disclosed in U.S. Pat. No. 4,438,723.

This apparatus is a continuous film forming apparatus for continuously forming semiconductor layers having p-, i-, or n-type conductivity (hereinafter referred to as a p-type layer, an i-type layer, and an n-type layer), for example, on a strip-like substrate, comprising a first reaction chamber for forming the p-type semiconductor layer, a second reaction chamber for forming the i-type semiconductor layer, and a third reaction chamber for forming the n-type semiconductor layer, wherein between the first and second reaction chambers, and between the second and third reaction chambers, separating means is provided for preventing an element constituting the p-type semiconductor layer and an element constituting the n-type semiconductor layer from mixing into the second reaction chamber, respectively, with the pressure of the second reaction chamber made higher than those of the first and third reaction chamber to effect the operation. The use of such continuous film forming apparatus allows a plurality of semiconductor layers having different compositions to be continuously deposited one over the other. The separating means is to isolate the adjacent reaction chamber from each other by providing a predetermined difference in internal pressure between the adjacent reaction chamber, thereby preventing the mutual diffusion of source gases for use in the reaction chamber. In this case, however, the separating means has a problem that there is a passage for the strip-like substrate provided through the adjacent reaction chamber, through which a source gas within the reaction chamber of the higher internal pressure inevitably mixes into the reaction chamber of the lower internal pressure, causing variations in the internal pressure within the latter reaction chamber, as well as in the plasma excited within the reaction chamber, so that it is difficult to form desired deposited films.

As a proposal for solving these problems in the continuous film forming apparatus as described in U.S. Pat. No. 4,438,723 as above cited, a continuous film forming apparatus having gas gate means has been disclosed in U.S. Pat. No. 4,462,332. The apparatus comprises a plurality of reaction chamber(i.e., a p-type semiconductor layer forming reaction chamber, an i-type semiconductor layer forming reaction chamber and an n-type semiconductor layer forming reaction chamber) wherein the gas gate means is provided between the adjacent reaction chambers, adjacent the i-type semiconductor layer forming reaction chamber. This gas gate means is to prevent the mutual diffusion of film forming source gases for use in the respective reaction chamber, having a structure such that a gate gas is introduced in only one direction to flow toward the p-type or n-type semiconductor layer forming reaction chamber. Also, the continuous film forming apparatus is provided with a magnet at an upper wall of the passage for the strip-like substrate through the gas gate means, whereby the strip-like substrate is brought into contact with the upper wall of the passage to reduce the size of the passage. This continuous film forming apparatus can solve some of the problems with the continuous film forming apparatus as described in U.S. Pat. No. 4,438,723, to some extent, but it is required to precisely control relevant parameters such as the conductance of the gas gate means or the flow rate of the gate gas to prevent the mutual diffusion of the source gases used across the adjacent reaction chamber. That is, for example, when a semiconductor photoelectric conversion element having a pin junction with high conversion efficiency is fabricated, it is necessary that the p-type and n-type semiconductor layers are relatively thin, and the i-type semiconductor layer is relatively thick, wherein each of the p-type and n-type semiconductors is formed by RF plasma CVD, for example, and the i-type semiconductor is formed by microwave plasma CVD which is capable of effecting fast film formation. In this case, the internal pressure of the i-type semiconductor forming reaction chamber during at the film formation is significantly lower than that of the p-type and n-type semiconductor forming reaction chambers during film formation. Therefore, it is required to prevent the inflow of impurities introducing source gases for use in the p-type and n-type semiconductor forming reaction chambers into the i-type semiconductor layer forming reaction chamber. However, this requirement is quite difficult to with the continuous film forming apparatus as described in U.S. Pat. No. 4,438,723. That is, in the continuous film forming apparatus as above described, the gas gate means is provided on either side of an i-type semiconductor forming chamber, causing the gate gas to flow via the gate gas means in the directions toward the p-type and n-type semiconductor forming reaction chambers. When the internal pressure of the i-type semiconductor forming reaction chamber is significantly lower than that of the p-type and n-type semiconductor forming reaction chambers, a reverse flow of a gas is caused, so that p- or n-type dopants containing source gas for use in the p-type or n-type semiconductor forming reaction chamber may mix into the i-type semiconductor forming reaction chamber. To solve this problem, a proposal has been made in Japanese Laid-Open Patent Application No. 3-30419 in which the gas gate means is provided centrally between the adjacent reaction chambers, so that the gate gas is introduced from the above and exhausted downward. A continuous film forming apparatus, according to this proposal, is comprised of a p-type semiconductor forming reaction chamber utilizing RF plasma CVD, an i-type semiconductor forming reaction chamber utilizing microwave plasma CVD, and an n-type semiconductor forming reaction chamber utilizing RF plasma CVD, wherein the gas gate means is provided centrally between the p-type semiconductor forming reaction chamber and the i-type semiconductor forming reaction chamber, and another gas gate means is provided centrally between the i-type semiconductor forming reaction chamber and the n-type semiconductor forming reaction chamber. However, in order that the gas gate means provided in the continuous film forming apparatus may sufficiently prevent the diffusion of source gases into the adjacent reaction chambers, it is necessary to decrease the conductance of a slit portion of the gas gate means, and/or increase the flow rate of the gate gas. However, in doing so, there is still left a problem to be solved. That is, the problem with the conductance of the slit portion is such that the conductance of the slit portion is governed by the shape of the slit portion so as to decrease in proportion to the length of the slit portion in the conveying direction of the strip-like substrate, and increases in proportion to the square of the height of the slit portion in the thickness direction of the strip-like substrate. Further, the size of the slit in the width direction of the strip-like substrate cannot be narrowed more than necessary due to the width of the strip-like substrate. Additionally, if the conductance of the slit portion is to be decreased, a problem arises that the strip-like substrate will inevitably vibrate or fluctuate in conveying the strip-like substrate. Therefore, in order to convey the strip-like substrate without contact of the film formation face with the wall face of the slit portion, it is necessary to provide a clearance of at least about 1 mm or more between the film formation face of the strip-like substrate and the wall face of the slit portion opposed to the film formation face. However, the provision of such clearance is naturally limited. Also, to decrease the conductance of the slit portion, it is conceived that the slit portion may be lengthened, but as the conductance only decreases in proportion to its length, the slit portion becomes quite longer, and the gas gate means becomes quite bulky so as to be impracticable. Also, the problem with the flow rate of the gate gas is such that when the flow rate of the gate gas is increased, the inflow rate of the gate gas into each reaction chamber correspondingly increases. In this case, a problem arises that the desired deposited film is difficult to form since variations are caused in the film forming conditions for each reaction chamber, including, for example, the internal pressure, the rate of dilution of the source gas, and the plasma state. To solve such problem, it is conceived that the exhausting ability of the vacuum pump used may be enhanced, but the vacuum pump may necessarily become larger in such event. Accordingly, this continuous film forming apparatus also has a problem to be improved in this respect.

SUMMARY OF THE INVENTION

An object of the present invention is to solve the aforementioned problems in the conventional methods for continuously forming photovoltaic elements with the roll-to-roll method, and to provide a method and apparatus for continuously forming functional deposited films such as for a photovoltaic element which are capable of carrying out the processes involving different pressures in a continuous operation with high productivity, while preventing the mutual mixing of impurity gases between film forming chambers.

The present invention provides a functional deposited film forming method in which functional deposited films are deposited on a strip-like substrate within a plurality of film forming chambers, while the strip-like substrate is being moved continuously in a longitudinal direction thereof through the plurality of film forming chambers and a gas gate connecting the film forming chambers, wherein the point of introduction of a scavenging gas is located on the high pressure film forming chamber side off from the center of a separation passage for the gas gate, connecting between a higher pressure film forming chamber for forming a low resistance semiconductor and a lower pressure film forming chamber for forming a high resistance semiconductor which constitute the plurality of film forming chambers.

A functional deposited film forming method wherein the deposited film forming methods in the film forming chambers are chosen from an RF plasma CVD method, a microwave plasma CVD method, a sputtering method, an ion plating method, a photo assisted CVD method, a thermal CVD method, a MOCVD method, a MBE method, a vacuum CVD method, and an electron beam vapor deposition method, and wherein the low resistivity semiconductor is a semiconductor of p- or n-type conductivity, and the high resistivity semiconductor is a semiconductor of i-type conductivity.

The functional deposited film forming method includes one in which the functional deposited film is a photovoltaic element.

The functional deposited film forming method includes one in which the pressure difference between the high pressure film forming chamber and the low pressure film forming chamber is from 0.1 Torr to 1.1 Torr.

The functional deposited film forming method includes one in which the pressure difference between the high pressure film forming chamber and the low pressure film forming chamber is from 0.2 Torr to 1.0 Torr.

The functional deposited film forming method includes one in which the ratio of distance from the scavenging gas introducing position to the high pressure film forming chamber relative to the total length of the gas gate in the substrate conveying direction is from 0.1 to 0.4.

Also, the present invention provides a functional deposited film deposition apparatus, comprising a plurality of film forming chambers, gas gates having a slit-like separation passage connecting the plurality of film forming chambers, conveying means for continuously conveying a strip-like substrate in a longitudinal direction thereof to pass through the plurality of film forming chambers and the gas gates, gas introducing means for introducing a scavenging gas into the gas gates, and depositing means for depositing each of the functional deposited films on the strip-like substrate within each of the plurality of film forming chambers, characterized in that the plurality of film forming chambers are comprised of a higher pressure film forming chamber for forming a low resistivity semiconductor and a lower pressure film forming chamber for forming a high resistivity semiconductor, and the introducing position of the scavenging gas is provided on the high pressure film forming chamber side off from the center of the separation passage of the gas gate.

The functional deposited film deposition apparatus includes one wherein the film forming chamber employs any one of RF plasma CVD, microwave plasma CVD, sputtering, ion plating, photo assisted CVD, thermal CVD, MOCVD, MBE, vacuum vapor deposition, and electron beam vapor deposition.

The functional deposited film deposition apparatus includes one wherein the low resistivity semiconductor film forming chamber is one for forming a semiconductor p- or n-type conductivity, and the high resistivity semiconductor film forming chamber is one for forming a semiconductor of i-type conductivity.

The functional deposited film deposition apparatus includes one in which the functional deposited film is a photovoltaic element.

The functional deposited film deposition apparatus includes one in which the pressure difference between the high pressure film forming chamber and the low pressure film forming chamber is from 0.1 Torr to 1.1 Torr.

The functional deposited film deposition apparatus includes one in which the pressure difference between the high pressure film forming chamber and the low pressure film forming chamber is from 0.2 Torr to 1.0 Torr.

The functional deposited film deposition apparatus also includes one in which the ratio of distance from the scavenging gas introducing position to the high pressure film forming chamber relative to the total length of the gas gate in the substrate conveying direction is from 0.1 to 0.5.

The functional deposited film deposition apparatus includes one in which the ratio of distance from the scavenging gas introducing position to the high pressure film forming chamber relative to the total length of the gas gate in the substrate conveying direction is from 0.1 to 0.4.

BRIEF DESCRIPTION OF THE DRAWINGS

FIG. 5 is a schematic view showing an apparatus for investigating the relationship between the pressure distribution within the gas gate and the gas separation performance.

DETAILED DESCRIPTION OF THE PREFERRED EMBODIMENTS

The embodiments of the present invention will be now described with reference to the drawings.

Figure 1:
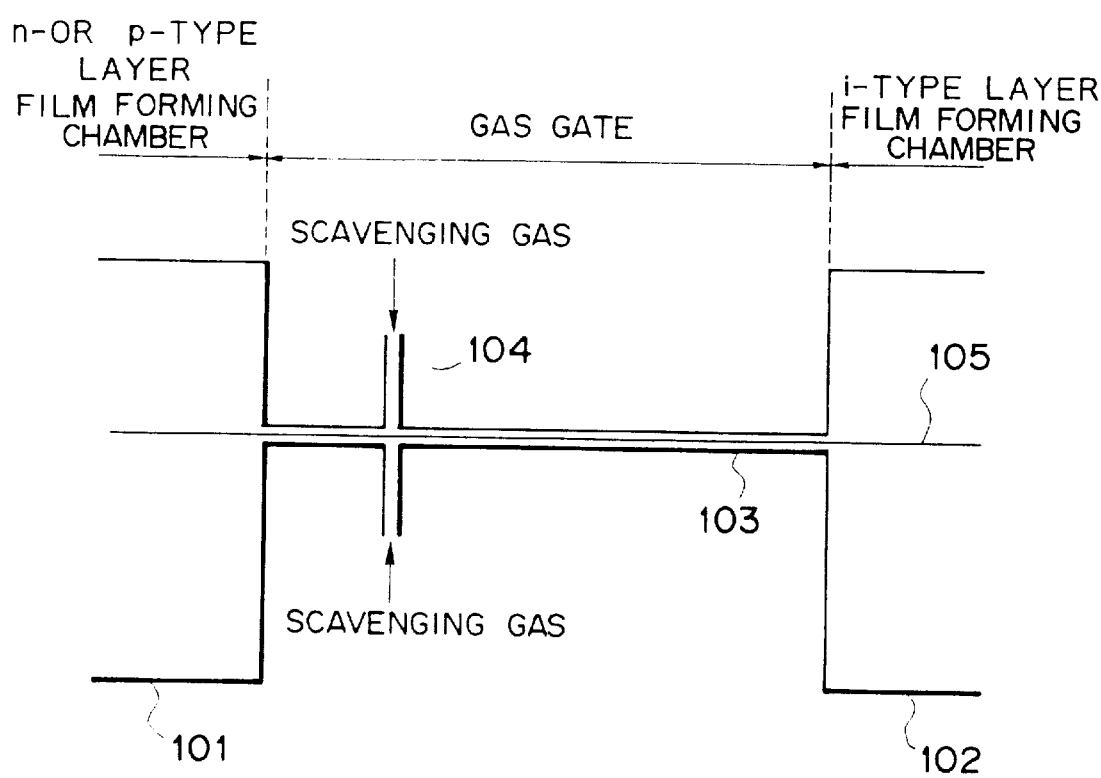
FIG. 1 is a schematic diagram showing a gas gate used in a continuous forming method for functional deposited films according to the present invention.

As shown in FIG. 1, the present invention relates to a method for continuously forming functional deposited films in order to continuously fabricate a photovoltaic element having semiconductor junctions, in which a semiconductor layer of desired conductivity type is deposited on a strip-like substrate 105 within each of a plurality of film forming chambers 101, 102, by plasma CVD, while the strip-like substrate 105 is being moved continuously in a longitudinal direction thereof to pass through the plurality of film forming chambers 101, 102 connected via gas gate 103 having a gate an introducing portion in a slit-like separation passage, wherein the gas gate 103 for connecting an i-type layer film forming chamber 102 and an n- or p-type layer film forming chamber 101 having higher a pressure than the i-type layer film forming chamber has an introducing tube 104 for the scavenging gas provided on the n- or p-type layer film forming chamber side off from the center of the separation passage of the gas gate 103 for introducing the scavenging gas thereinto, thereby enhancing the gas separation performance of the gas gate and effectively preventing impurity gases from the film forming chamber 101 from mixing into the i-type layer film forming chamber 102.

Figure 2:
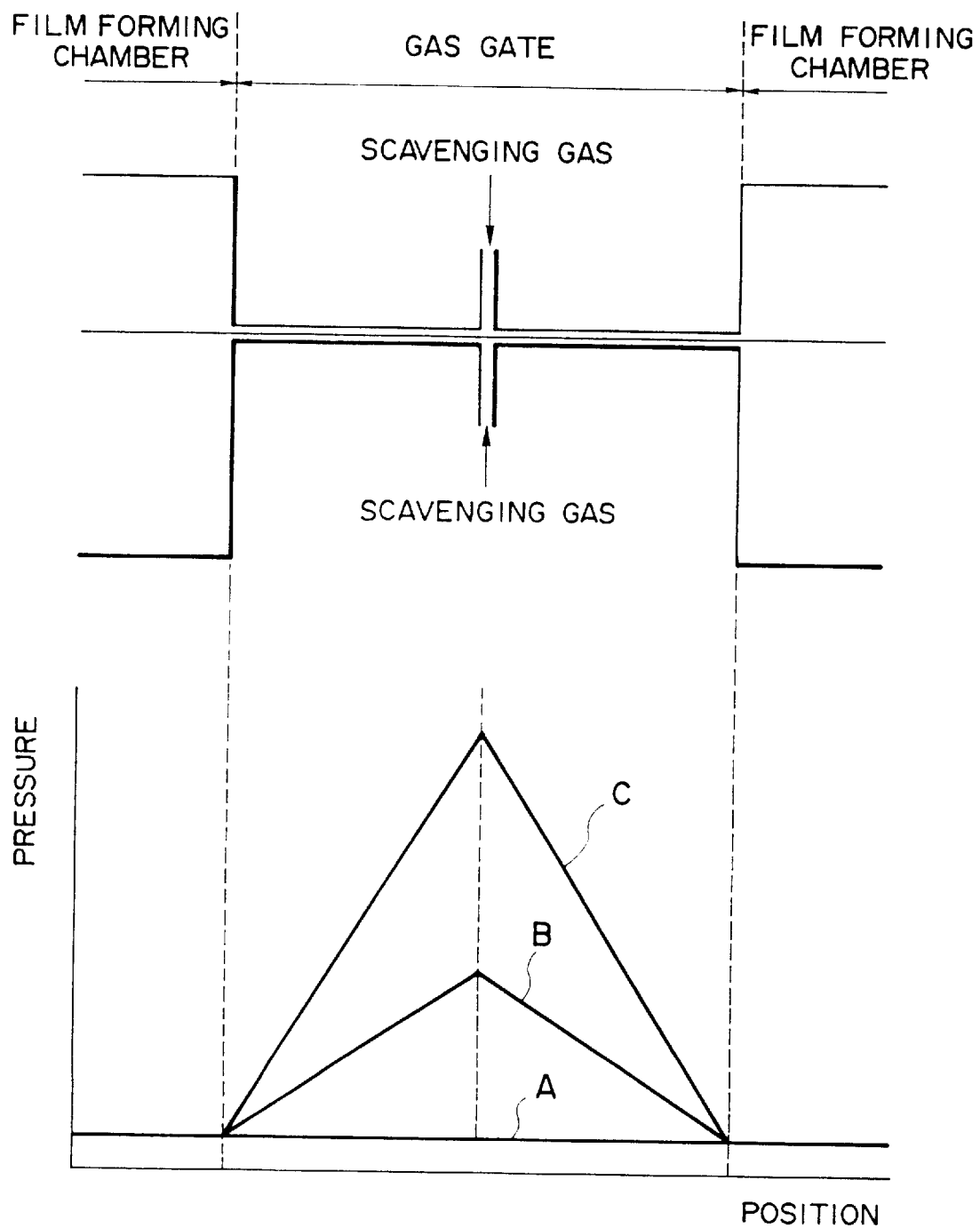
FIG. 2 is a schematic diagram showing the relationship between the pressure distribution within the gas gate and the gas flow or gas introducing position in a continuous forming apparatus where the pressure in the adjacent chambers is equal.

When two film forming chambers connected via the gas gate have identical pressure, the pressure in the separation passage within the gas gate will be a maximum at the introducing position of the scavenging gas, as shown in FIG. 2, if the scavenging gas is introduced. As shown in FIG. 2, if the pressure of the scavenging gas is increased from A to B to C, the pressure at the introducing position of the scavenging gas increases in accordance with the amount of the scavenging gas introduced, forming a flow of gas from the scavenging gas introducing position to each of the two film forming chambers, so that the gases within the two film forming chambers are prevented from mixing with each other.

Figure 3:
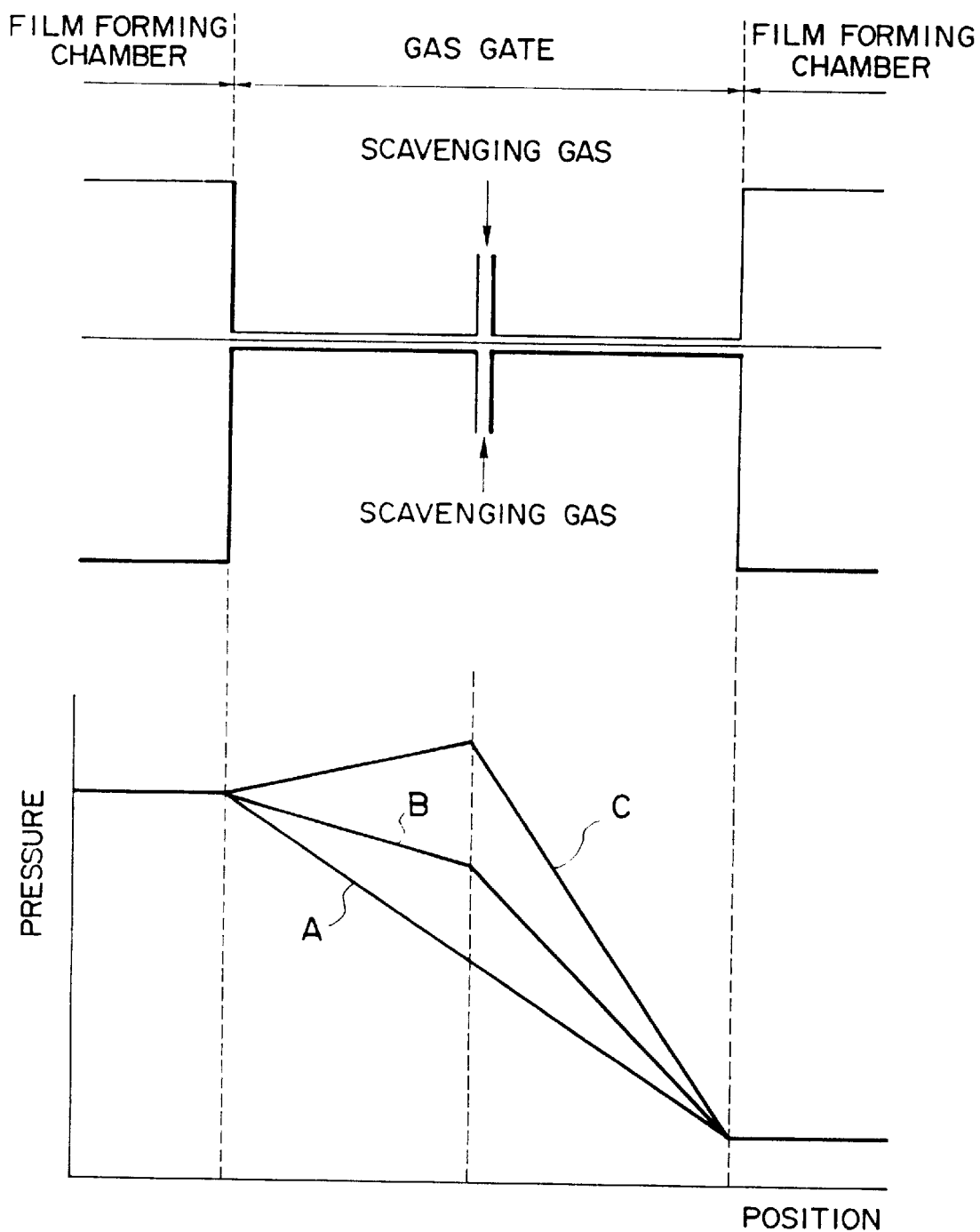
FIG. 3 is a schematic diagram showing the relationship between the pressure distribution within the gas gate and the gas flow or gas introducing position.

However, when there is a pressure difference between two film forming chambers connected via the gas gate, the pressure in the separation passage within the gas gate does not necessarily become a maximum at the scavenging gas introducing position when the scavenging gas is introduced. The pressure distribution within the gas gate changes with the flow rate of the scavenging gas, as shown in FIG. 3, in which A indicates when no scavenging gas flows, B indicates when a small quantity flows, and C indicates when a large quantity flows, wherein when a small quantity of the scavenging gas is provided, the pressure in the separation passage within the gas gate becomes maximum at the aperture on the higher pressure film forming chamber side between two film forming chambers having a pressure difference.

With a method as disclosed in U.S. Pat. No. 4,438,723 teaching that a pressure difference is provided between two film forming chambers connected via the gas gate, the scavenging gas is fed into a gas gate aperture for a film forming chamber having higher the pressure (hereinafter referred to as a higher pressure film forming chamber) among two film forming chambers having a pressure difference, so that the pressure in the separation passage within the gas gate becomes maximum at the aperture on the higher pressure film forming chamber side.

In this way, when there is some pressure difference between two film forming chambers connected via a gas gate, the pressure distribution within the gas gate is not consistent, unlike the case where no pressure difference exists between adjacent chambers.

Thus, the present inventors have examined the relationship between the pressure distribution within the gas gate and the gas separation performance, using an apparatus as shown in FIG. 5, in the case where there is pressure difference between two adjacent film forming chambers. In FIG. 5, 501 is a higher pressure film forming chamber, and 502 is a lower pressure film forming chamber. 503 is a gas gate, 504 is a strip-like substrate, 505 are pressure gauges, 506 is a quadrupole mass spectrometer, 507 is a gas introducing tube, and 508 is an exhaust tube.

In this apparatus, the lower pressure film forming chamber was prefilled with 200 sccm $H_2$, instead of a film forming gas, and the higher pressure film forming chamber was prefilled with 200 sccm He, instead of an impurity gas. $H_2$ was used as the scavenging gas for the gas gate. One-half the amount of scavenging gas was introduced through each of the upper and lower gas introducing tubes and the amount of He flowing from the higher pressure film forming chamber into the lower pressure film forming chamber was measured, using the quadrupole mass spectrometer connected to the lower pressure film forming chamber. With a small amount of He flowing into the lower pressure film forming chamber, smaller amount of the impurity gas flowed into the lower pressure film forming chamber, whereby it was determined that the gas separation performance between the film forming chambers is high. Also, the pressure within the gas gate was measured using pressure gauges provided in the scavenging gas introducing portion and each of the film forming chamber apertures. Note that the pressure of the lower pressure film forming chamber was constant at 5 mTorr, and that of the higher pressure film forming chamber was changed from 1 Torr to 0.75 Torr.

Figure 6:
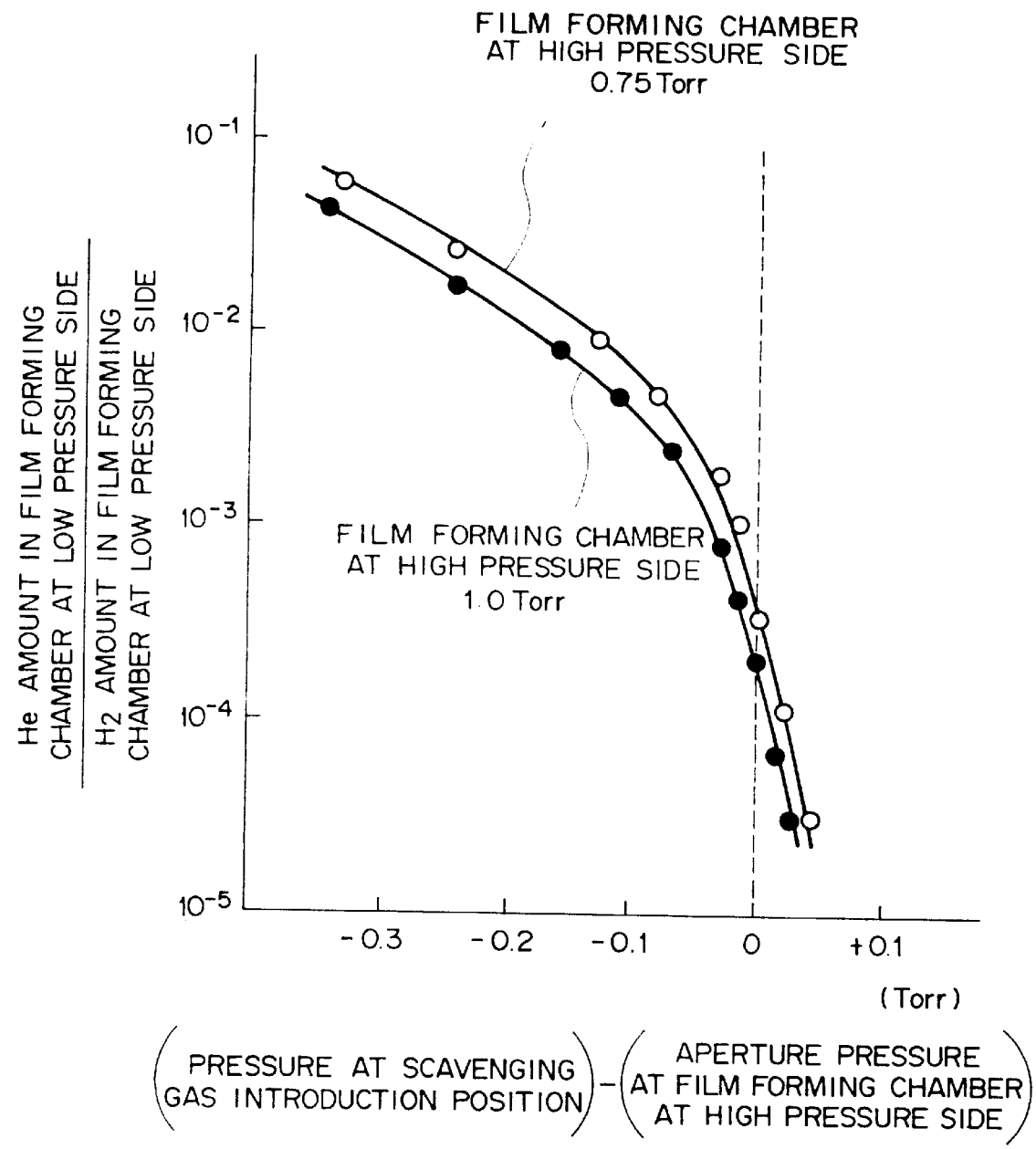
FIG. 6 is a graphic representation showing the relationship between the pressure distribution within the gas gate and the gas separation performance.

As a result, it has been found that a relationship as shown in FIG. 6 exists between the amount of the impurity gas flowing from the higher pressure film forming chamber into the lower pressure film forming chamber and the pressure within the gas gate. That is, it has been found that as the pressure at the scavenging gas introducing position increases with increasing amount of the introduced scavenging gas, the mixing amount of the impurity gas from the higher pressure film forming chamber into the lower pressure film forming chamber decreases, and the inflow of the impurity gas from the higher pressure film forming chamber into the lower pressure film forming chamber rapidly decreases in the region where the pressure at the scavenging gas introducing position is high than that at the aperture on the high pressure film forming chamber side, so that the gas separation performance of the gas gate is rapidly improved.

Figure 4:
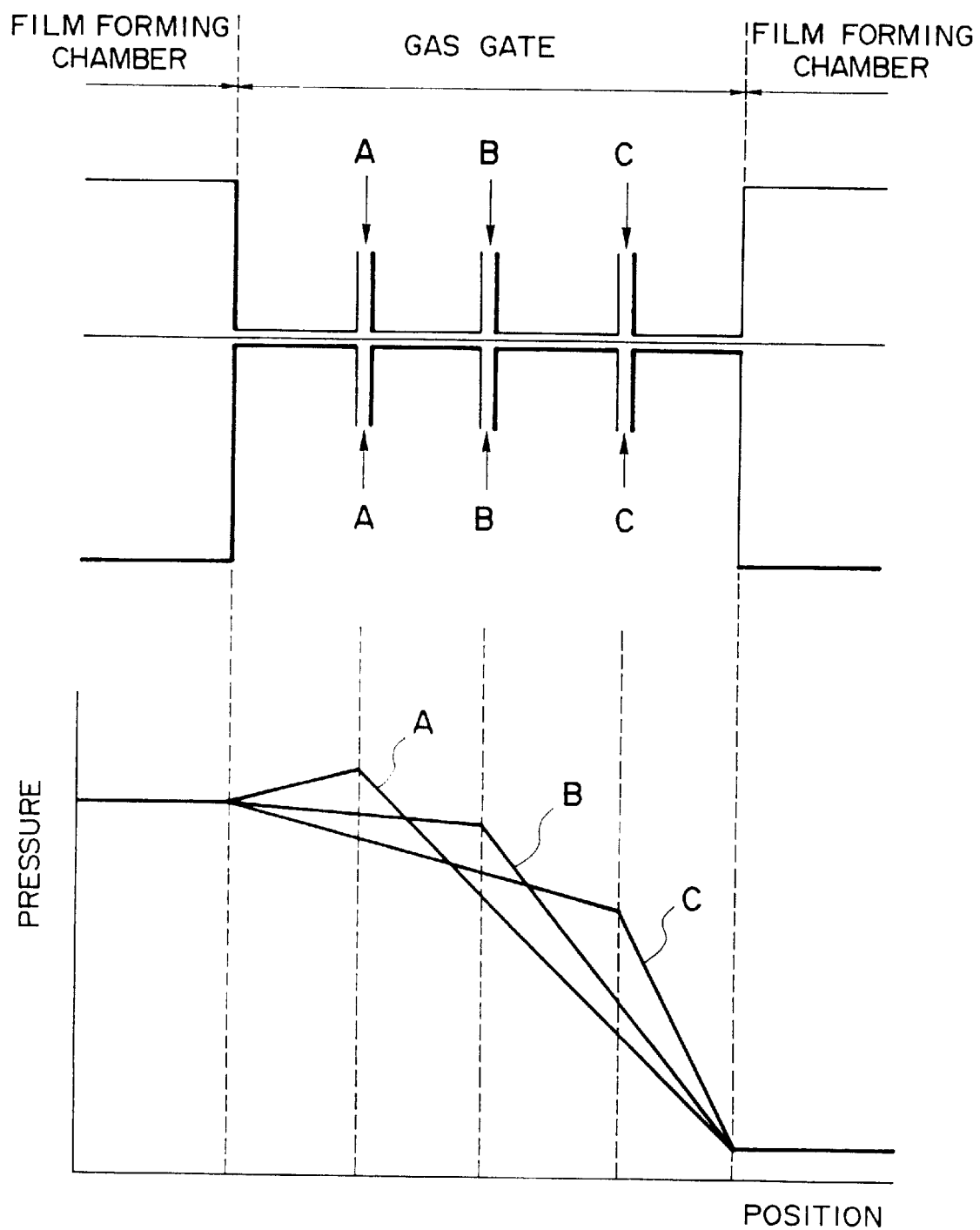
FIG. 4 is a schematic diagram showing the relationship between the pressure distribution within the gas gate and the gas flow or gas introducing positions when the pressure in the adjacent chambers is unequal.

Further, the present inventors successively changed the introducing position of the scavenging gas to the center of the gas gate, the higher pressure film forming chamber side, and the lower pressure film forming chamber side, while maintaining the flow of the introduced scavenging gas into the gas gate constant, and measured the pressure at the scavenging gas introducing position and the inflow of the impurity gas into the lower pressure film forming chamber, whereby it was found that the pressure at the scavenging gas introducing position increases and the amount of the impurity gas introduced to the lower pressure film forming chamber decreases if the scavenging gas is introduced to the higher pressure film forming chamber side off from the center of the gas gate, while if the scavenging gas is introduced into the lower pressure film forming chamber side, the pressure at the scavenging gas introducing position decreases and the amount of the impurity gas flowing into the lower pressure film forming chamber increases, whereby there is no need for changing the length of the gas gate or the flow of the scavenging gas, as shown in FIG. 4.

That is, it has been found that by introducing the scavenging gas from the n- or p-type layer film forming chamber side, away from the center of the gas gate or the i-type layer film forming chamber side as was conventionally introduced, the pressure at the scavenging gas introducing position can be made higher than that at the aperture on the higher pressure film forming chamber side, with a smaller amount of the introducing scavenging gas, and the inflow of the impurity gas from the higher pressure film forming chamber into the lower pressure film forming chamber can be effectively decreased. The present invention has been achieved based on such a finding.

The principle that when there is a significant pressure difference between film forming chambers connected via a gas gate, the inflow of impurity gas into the lower pressure film forming chamber can be decreased by placing the scavenging gas introducing position closer to the higher pressure film forming chamber side, as above described, will be described below. For simplification, it is assumed that the cross-sectional shape of an aperture (width and height of a slit portion) in a perpendicular direction to the conveying direction of a strip-like substrate in the gas separation passage of the gas gate is invariant with respect to the conveying direction of the strip-like substrate, and the state where no strip-like substrate is provided is considered.

(1) The case where no pressure difference exists between film forming chambers connected via gas gate will now be considered. If no scavenging gas is introduced, the flow in the film forming chamber is only a slight diffusion of a film forming gas through the separation passage of the gas gate. In this state, if the scavenging gas is introduced into the gas gate, the introduced scavenging gas is divided in proportion to the conductance of the separation passage from the scavenging gas introducing position was to flow into each film forming chamber while suppressing the diffusion of the film forming gas between the film forming chambers. It is the flow of scavenging gas from the scavenging gas introducing position to the film forming chamber for introducing an impurity gas that suppresses the diffusion of the impurity gas from the film forming chamber for introducing the impurity gas into the film forming chamber for forming an intrinsic semiconductor.

And with the smaller conductance of the separation passage from the scavenging gas introducing position into the film forming chamber for introducing the impurity gas, and the greater flow of the scavenging gas in the separation passage from the scavenging gas introducing position into the film forming chamber for introducing the impurity gas, the amount of the impurity gas diffusing into the film forming chamber for forming the intrinsic semiconductor will decrease. And when the scavenging gas is introduced into the center of the gas gate, the amount of impurity gas diffusion becomes minimal.

For example, supposing that the conductance of the gas gate over its entire length in the conveying direction of the strip-like substrate is C, the flow of the introduced scavenging gas into the gas gate is Q, the point of introducing the scavenging (the central point of an introduction inlet) is set at a point satisfying a relationship of the distance up to the film forming chamber for the introducing impurity gas: the distance up to the film forming chamber for forming the intrinsic semiconductor=x:1−x(0≦x≦1), it will be found that the conductance is proportional to the length of a pipe, so that the conductance C' from the scavenging gas introducing position to the film forming chamber for introducing the impurity gas and the flow of the scavenging gas Q' from the scavenging gas introducing position to the film forming chamber for introducing the impurity gas are expressed as follows.

$$C'=C/x$$

$$Q'=Q(1-x)$$

With the smaller conductance C' for the separation passage from the scavenging gas introducing position to the film forming chamber for introducing he impurity gas, and the greater flow of the scavenging gas Q' in the separation passage, the amount of the diffusion of impurity gas into the film forming chamber for forming the intrinsic semiconductor will decrease, wherein it is considered that the gas separation performance is proportional to Q'/C'. Because of the relationship $Q'/C'=Q(1-x)/(C/x)=(Q/C)(1-x)x$, the gas separation performance Q'/C' is at a maximum and the amount of diffusion of the impurity gas is at a minimum, at x=0.5, that is, when the scavenging gas is introduced into the center of the gas gate in the case where there is no pressure difference between the film forming chamber.

Also, if there is no pressure difference between the film forming chambers, the scavenging gas is divided at a ratio of the conductance in the separation passage and flows into each film forming chamber, whereby if the scavenging gas introducing position is set on the side of the n- or p-type layer film forming chamber for introducing the impurity gas off from the center of the gas gate, more of the introduced scavenging gas will flow into the n- or p-type layer film forming chamber. However, the photovoltaic element has a problem that since the film thickness of the n- or p-type layer is about one-tenth that of the i-type layer, the source gas introduced into the n- or p-type layer film forming chamber is significantly less than the source gas introduced into the i-type layer film forming chamber, and when the inflow of the scavenging gas is increased, a small amount of a source gas may be diluted to a low concentration by flowing the scavenging gas. For the above reason, conventionally, it was necessary that the scavenging gas be introduced into the center of the gas gate or the position closer to the i-type layer film forming chamber off from the center, when there was almost no pressure difference between the film forming chambers connected via the gas gate.

(2) The case where significant pressure difference exists between the film forming chambers will be considered next.

If the scavenging gas is not introduced, the film forming gas within the high pressure film forming chamber flows through the separation passage of the gas gate into the lower pressure film forming chamber due to the pressure difference. Therefore, when the higher pressure film forming chamber is a film forming chamber with impurity gas introduction for forming a p- or n-type semiconductor, and the lower pressure film forming chamber is a film forming chamber for the intrinsic semiconductor, the film forming chamber for the intrinsic semiconductor will have a much greater amount of the impurity gas mixed thereinto due to diffusion then when no pressure difference exists. Accordingly, if some pressure difference exists, it is first necessary to stop the inflow of the impurity gas due to the pressure difference in order to suppress mixture of the impurity gas. When the scavenging gas is introduced into the central region of the gas gate connecting the film forming chambers having a pressure difference, the pressure distribution within the gas gate is as shown in FIG. 3. When the amount of the scavenging gas introduced is small, all the introduced scavenging gas will flow into the lower pressure film forming chamber (curve B in the figure), but if the amount introduced is increased so that the pressure at the scavenging gas introducing position exceeds that within the higher pressure film forming chamber (curve C), the inflow of the impurity gas from the higher pressure film forming chamber is stopped (but the diffusion remains), thereby causing inflow of the scavenging gas into the higher pressure film forming chamber. If the amount of the introduced scavenging gas is increased so that the pressure P' at the scavenging gas introducing position is equal to that pressure $P_H$ within the higher pressure film forming chamber, the flow of the film forming gas is due only to diffusion between the film forming chambers, so that introduced scavenging gas Q will flow through the separation passage of the gas gate (conductance $C''=C/(1-x)$) from the scavenging gas introducing position into the film forming chamber at the lower pressure side. Accordingly, the following relationship holds:

$$P'=P_L+Q/C''=P_L+Q(1-x)/C=P_H$$

(Where $P_L$ is the pressure within the film forming chamber at the lower pressure side.) From the above relationship, it can be recognized that with the smaller value x, the pressure P' at the scavenging gas introducing position is higher, so that mixture of the impurity gas can be prevented with the smaller scavenging gas Q, and the scavenging gas is more effectively introduced at a position close to the higher pressure film forming chamber than at the center of the gas gate.

In the present invention, a position off from the center of the separation passage of the gas gate means a position on the separation passage lying between the central position between the i-type layer film forming chamber and the n- or p-type layer film forming chamber and the aperture of the n- or p-type layer film forming chamber. Since it is necessary to form a flow of the scavenging gas in the separation passage into the n- or p-type layer film forming chamber in order to prevent the impurity gas from mixing into the i-type layer film forming chamber, the scavenging gas introducing position is preferably spaced slightly away from the aperture end of the n- or p-type layer film forming chamber. Also, when there is almost no pressure difference between the film forming chambers connected via the gas gate, the scavenging gas is preferably introduced from the center of the gas gate, as previously described, while when significant pressure difference is present, it is preferably introduced at a position closer to the side of higher pressure film forming chamber containing impurity gas. Accordingly, the optimal position for introducing the scavenging gas may change in the range from the center of the gas gate to the vicinity of the aperture of the higher pressure film forming chamber, depending on the pressure of the film forming chambers connected via the gas gate. Thus, the present inventors have investigated the relationship between the scavenging gas introducing position into the gas gate and the amount of the impurity gas mixing into the film forming chamber at the lower pressure side, by changing the scavenging gas introducing position, with the scavenging gas flow rate fixed, using an apparatus as shown in FIG. 5, when there is a significant pressure difference between the film forming chambers. Note that in this apparatus, the lower pressure film forming chamber was prefilled with $H_2$ of 200 sccm, instead of a film forming gas, and the higher pressure film forming chamber was prefilled with He of 200 sccm instead of the impurity gas, $H_2$ was used as the scavenging gas for the gas gate and equal amounts thereof were introduced through each of upper and lower gas introducing tubes for the gas gate, and the amount of He flowing from the higher pressure film forming chamber to the lower pressure film forming chamber was measured, using a quadrupole mass spectrometer connected to the lower pressure film forming chamber. Note that the pressure of the lower pressure film forming chamber was 5 m Torr, i.e. within a pressure range suitable for a microwave CVD method, and the pressure of the higher pressure film forming chamber was 1 Torr, within a pressure range suitable for an RF CVD method.

Figure 10:
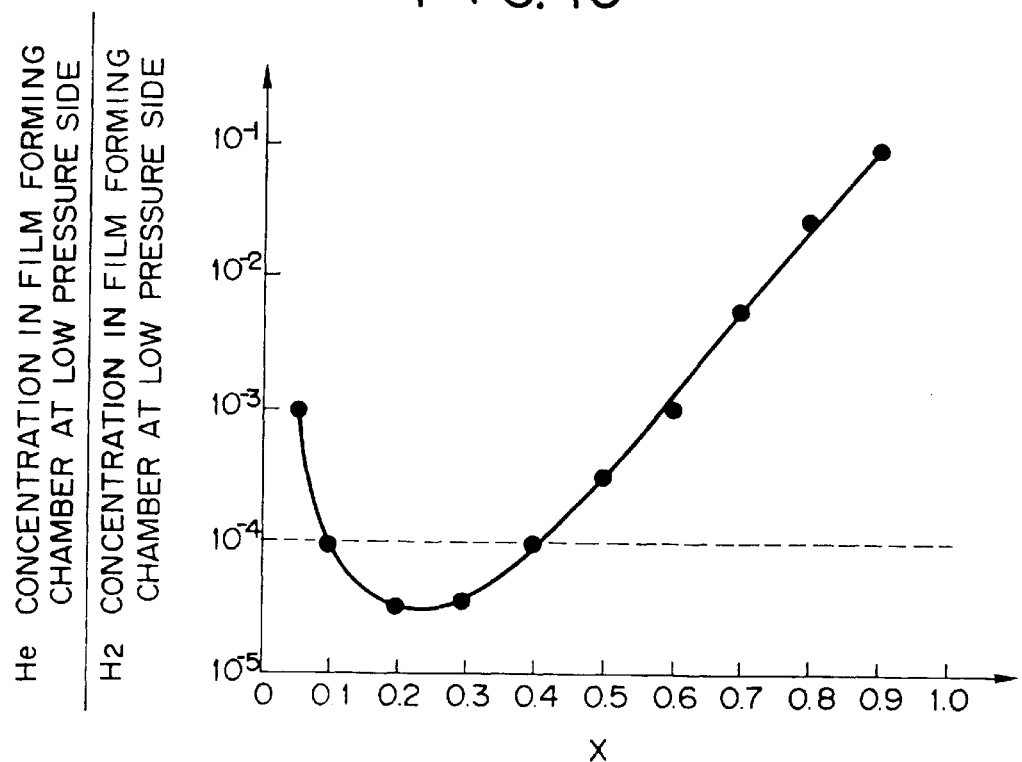
FIG. 10 is a graphic representation showing the relationship between the scavenging gas introducing position into the gas gate and the gas separation performance.

As a result, representing the scavenging gas introducing position by x as previously noted, the amount of the impurity gas mixing into the film forming chamber at the lower pressure side was changed relative to x, as shown in FIG. 10.

U.S. Pat. No. 4,438,723 has taught the practical ability of reducing the impurity gas concentration via the use of a gas gate, wherein if the impurity gas concentration in the film forming chamber for forming a p- or n-type semiconductor is reduced by a factor of $10^{-4}$ in the intrinsic semiconductor film forming chamber not containing the impurity gas via the gas gate, the gas separation performance can be determined to be practical, it being found from FIG. 10 that the scavenging gas introducing position is preferably in a range of $0.1 \leq x \leq 0.4$.

Next, the present inventors have investigated the relationship between the pressure difference between the film forming chambers connected via the gas gate and the amount of the impurity gas mixing into the film forming chamber at the lower pressure side, by changing the pressure of the film forming chamber at the higher pressure side from 0.05 Torr to 1.3 Torr, with the scavenging gas introducing position fixed at a position on the p- or n-type film forming chamber side containing the impurity gas with x=0.25, using the same apparatus.

Figure 11:
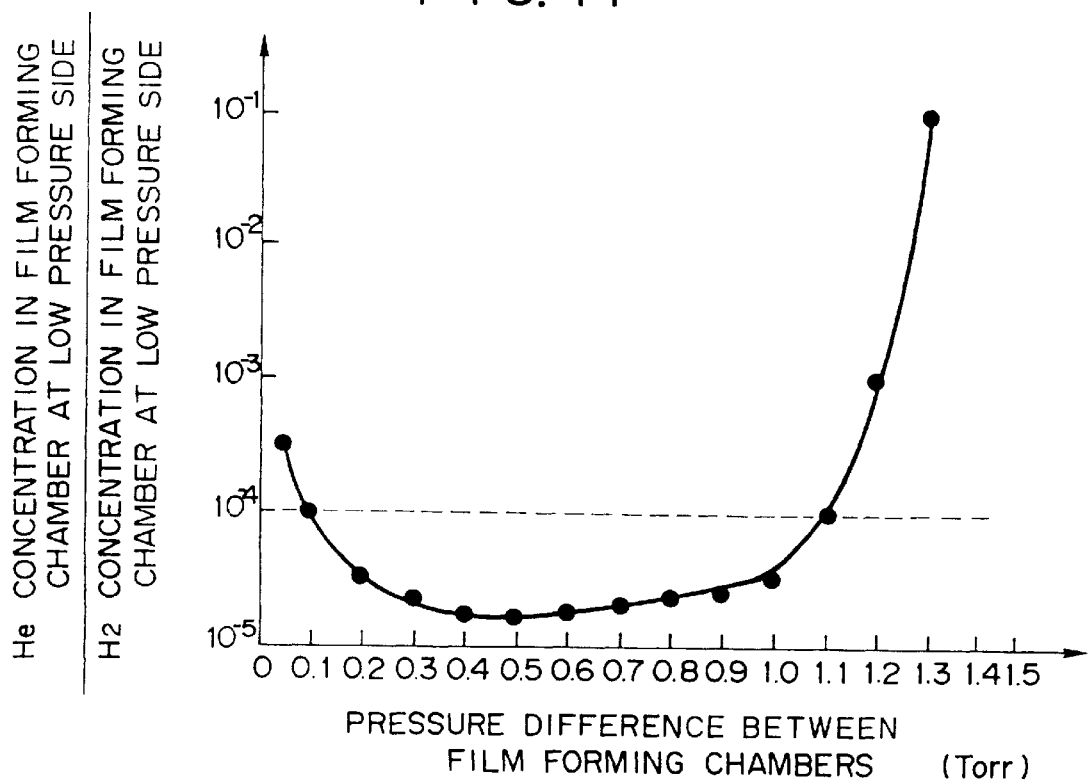
FIG. 11 is a graphic representation between the pressure difference between film forming chambers connected via the gas gate and the gas separation performance.

As a result, the amount of the impurity gas into mixed the film forming chamber at the lower pressure side relative to the pressure difference between the film forming chambers changes as shown in FIG. 11, wherein it can be found that practical gas separation performance can be obtained for a pressure difference between the film forming chambers in a range from 0.1 to 1.1 Torr. Thus, the pressure difference between the film forming chambers is preferably in a range form 0.1 to 1.1 Torr, and more preferably in a range from 0.2 to 1.0 Torr.

Examples of the scavenging gas to be flowed into the gas gate in the present invention include dilution gases such as Ar, He, Ne, Kr, Xe, Rn, and a gas used to delete the deposited film forming gas, such as $H_2$. In order to increase the pressure at the scavenging gas introducing position, it is necessary to select a scavenging gas having a large molecular weight if the pressure of the separation passage within the gas gate is in a molecular flow region, or to select a scavenging gas having a large viscosity coefficient if it is in a viscous flow region. The kind of scavenging gas required can be determined in accordance with the forming conditions of the deposited film, the gas separation performance required, and the gas exhausting ability of each film forming chamber.

In the present invention, film forming means disposed within the film forming chambers connected via the gas gate include a variety of means used in forming functional deposited films, including RF plasma CVD, microwave plasma CVD, sputtering, ion plating, photo assisted CVD, heating CVD, MOCVD, MBE, vacuum vapor deposition, and electron beam vapor deposition.

In the present invention, the impurity gas introduced into the film forming chambers for deposition of n- or p-type layers is a source material for introducing dopant impurities used for valance electron control of the film formed within the film forming chamber, and when the deposited film is a IV-Group IV semiconductor, source materials useful for introducing the dopant impurities include those which are in gaseous state at ordinary temperatures and ordinary pressures, or easily gasified at least under the film forming conditions. The starting materials for introduction of such dopant impurities include $PH_3$, $P_2H_4$, $PF_3$, $PF_5$, $PCl_3$, $AsH_3$, $AsF_3$, $AsF_5$, $AsCl_3$, $SbH_3$, $SbF_5$, $BlH_3$, and the like for the introduction of n-type dopant impurities, and $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, and the like for the introduction of the p-type dopant impurities. One of more compounds containing such impurity elements as above cited may be employed.

Figure 7:
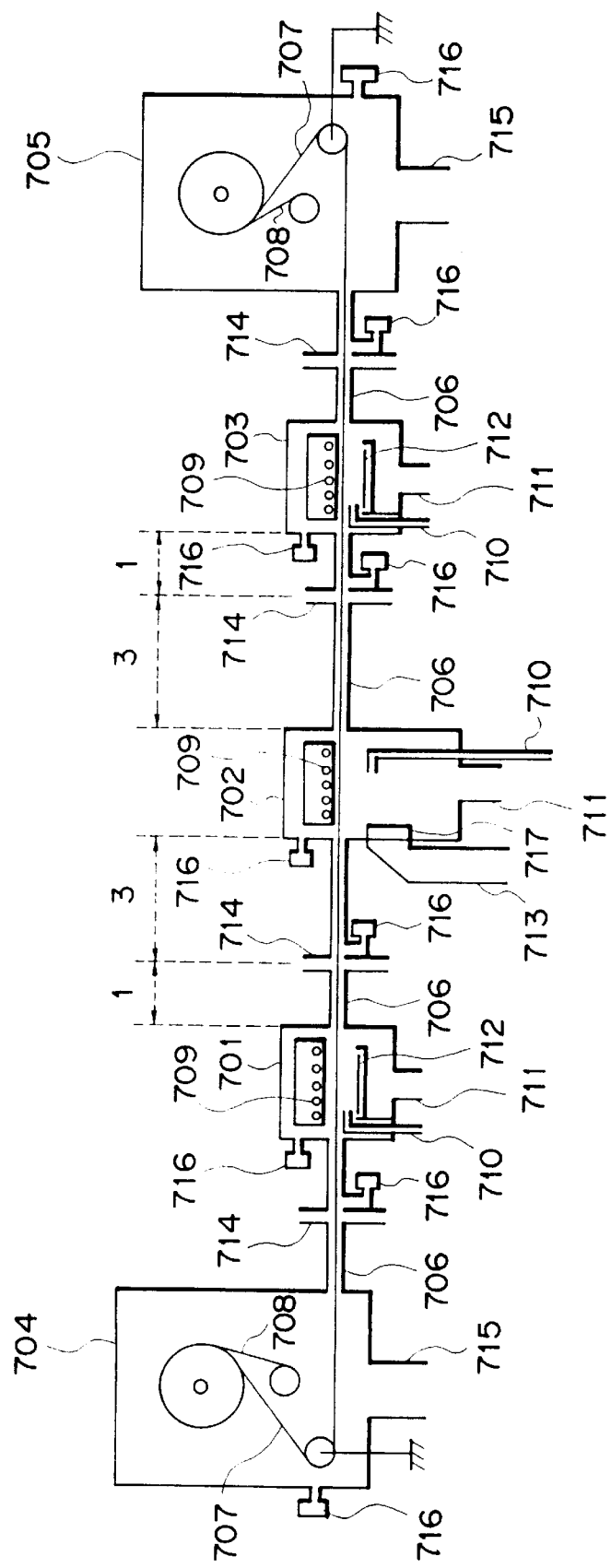
FIG. 7 is a schematic view showing a functional deposited film deposition apparatus for implementing a continuous forming method for functional deposited films according to the present invention.

In order to carry out the continuous forming method for the functional deposited films according to the present invention, an appropriate apparatus can be used, and an example of the constitution of such apparatus is shown in FIG. 7.

In FIG. 7, 701 and 703 are film forming chambers for forming n- or p-type layers by RF plasma CVD at 13.56 MHz, 702 is a film forming chamber for forming an i-type layer by microwave plasma CVD, 704 is a supply chamber of the strip-like substrate 707, and 705 is a takeup chamber of the strip-like substrate. The film forming chambers for forming the semiconductors of n-type, p-type, and i-type conduction type are connected by four gas gates 706. 707 is the strip-like substrate, passing through three film forming chambers as conveyed from the supply chamber 704 of the strip-like substrate to the takeup chamber 705, on the surface of the which are formed functional deposited films comprising three layers, e.g., semiconductor layers for a photovoltaic element having a pin junction. Note that 708 is a strip-like sheet composed of heat-resistant non-woven fabric, which is wound along with the strip-like substrate to protect the surface of the strip-like substrate.

Each of the film forming chambers 701, 702, 703 is provided with a heater 709 for heating the substrate, a gas introducing tube 710, an exhaust tube 711 for exhausting the film forming chamber by exhausting means (not shown), a discharge electrode 712 for exciting discharge by supplying energy to the film forming gas within the film forming chambers 701 and 703 and applying RF electric power, a wave-guide 713 for supplying microwave power to film forming chamber 702, and microwave introducing window 717 made of ceramic, wherein the film forming chambers 701 and 703 form the n-type and p-type layer deposited films by the RF microwave plasma CVD, respectively, and the film forming chamber 702 forms the i-type layer deposited film by the microwave CVD. Each of the gas gates 706 has a scavenging gas introduced through the scavenging gas introducing tube 714 to prevent the film forming gases from mixing between the adjacent film forming chambers. In the gas gate connecting the film forming chamber 702 for deposition of the i-type layer and the film forming chamber for deposition of the n-type 701 layer and the gas gate connecting the film forming chamber for deposition of the i-type layer 702 and the film forming chamber for deposition of the p-type layer 703, the scavenging gas introducing tube 714 is disposed closer to the film forming chambers for depositing the n-type and p-type layers, i.e. off from the center of the gas gate, for example, at a position where the ratio of its distance to the i-type layer film forming chamber to its distance to the p-type or n-type layer film forming chamber is 3:1.

715 is an exhaust tube for exhausting the supply chamber 704 and the takeup chamber 705 for the strip-like substrate, 716 is a pressure gauge for measuring the pressure within each film forming chamber 701, 702, 703, and each of the supply chamber 704 and the takeup chamber 705 for the strip-like substrate.

Figure 8:
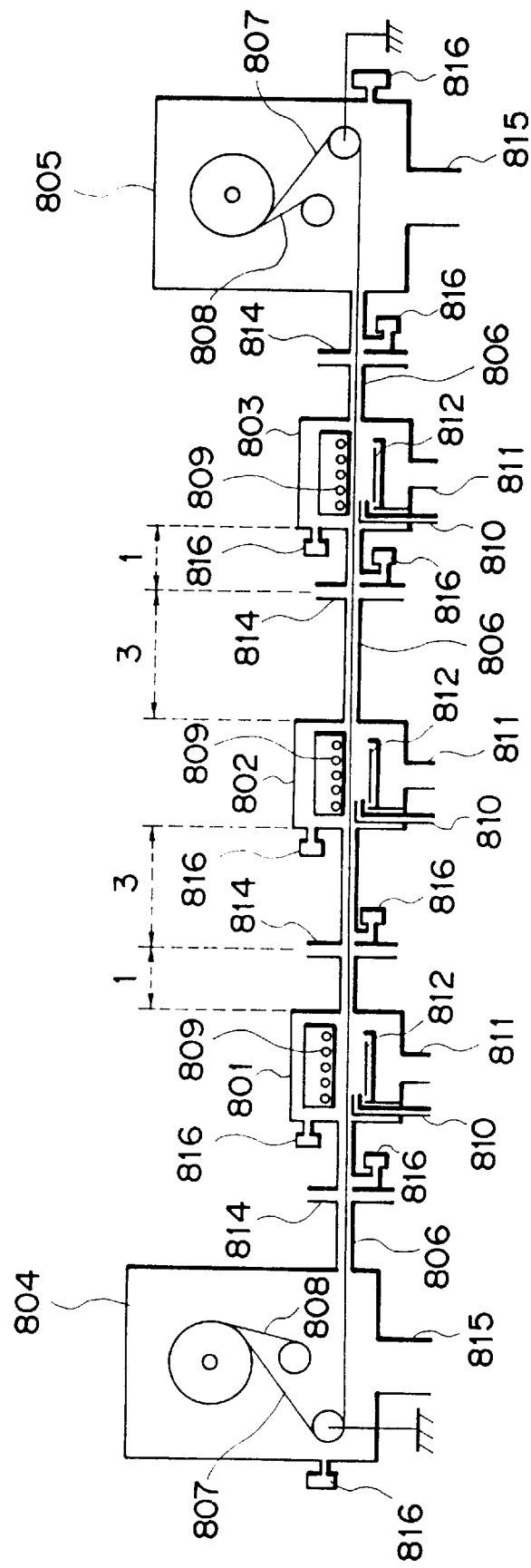
FIG. 8 is a schematic view showing another functional deposited film deposition apparatus for implementing a continuous forming method for functional deposited films according to the present invention.

Another apparatus for carrying out the method of the invention is shown in FIG. 8. The apparatus as shown in FIG. 8 involves RF plasma CVD as the film depositing method for the film forming chamber for the deposition of the i-type layer, rather than the microwave CVD as shown in FIG. 7. In the figure, 801 to 812 and 814 to 816 respectively correspond to 701 to 712 and 714 to 716 in FIG. 7.

The present invention will be specifically described below by way of example, to which the present invention is by no means limited.

EXAMPLE 1

Using an apparatus as shown in FIG. 7, n-type, i-type, and p-type layer amorphous silicon films are continuously formed on a strip-like substrate by the method of the present invention, according to the following procedure.

First, a strip-like stainless steel substrate 707 having a width of 30 cm, 50 m long and 0.2 mm thick, was delivered from the supply chamber 704, passing through three film forming chambers 701, 702, 703, and taken up in the takeup chamber 705. The separation passage of the gas gate connecting each film forming chamber was 2 mm in height, 40 cm in length, and 31 cm in width. Next, after each chamber vacuum was evacuated sufficiently through exhaust tubes 711, 715, a desired film forming gas was introduced through the gas introducing tube 710 into each film forming chamber while further evacuating the vacuum chamber, and the rate of exhaust was regulated by checking the pressure gauge 716 so that each film forming chamber was set at a predetermined pressure. Ar scavenging gas was introduced in equal amounts of 500 sccm into upper and lower portions of the gas gate 706. The gas introducing tube 714 was disposed at a position with the distance ratio of 1:3, closer to the n- and p-type layer film forming chambers, for the gas gates connecting between the i-type layer film forming chamber and the n-type and p-type layer film forming chambers, and at the central position of the gas gate of the other gas gates.

At this point, the pressure in each chamber was 0.500 Torr at 704, 0.500 Torr at 701, 0.005 Torr at 702, 0.500 Torr at 703, and 0.500 Torr at 705, i.e. with a pressure difference between the film forming chambers 701, 702, and between the film forming chambers 702, 703. While introducing the scavenging gas, the measurement of the pressure in the separation passage within the gas gate connecting the film forming chambers, using a pressure gauge 716 provided at the scavenging gas introducing position, showed that the pressure at the scavenging gas introducing position between the film forming chambers 701, 702 and between 702, 703 was each 0.520 Torr, which was higher than the pressure at the apertures of each film forming chamber, i.e., 0.500 Torr and 0.005 Torr, whereby it was confirmed that the pressure of the separation passage of the gas gate was at a maximum at the scavenging gas introducing position.

The strip-like substrate 707 was heated from the back side thereof by heaters 709 up to a predetermined temperature, a plasma discharge was excited within each film forming chamber by introducing RF power from the discharge electrodes 712 and microwave power from the waveguide 713 to continuously form n-, i-, and p-type amorphous silicon films on the strip-like substrate while conveying the strip-like substrate at a constant speed. The fabrication conditions within each film forming chamber are listed in Table 1.

TABLE 1

| Film forming chamber | Layer thickness of deposited film (Å) | Gas flow (sccm) | Pressure (Torr) | Discharge power (W) | Heating temperature (° C.) | Deposition rate (Å/s) |
|---|---|---|---|---|---|---|
| 701 | n-type a-morphous silicon (200) | $SiH_4$:50 $PH_3$:0.5 $H_2$:200 | 0.5 | RF (100) | 350 | 3 |
| 702 | i-type a-morphous silicon (4000) | $SiH_4$:400 $H_2$:1000 | 0.005 | microwave (800) | 350 | 150 |
| 703 | p-type a-morphous silicon (100) | $SiH_4$:50 $B_2H_6$:0.5 $H_2$:200 | 0.5 | RF (100) | 300 | 3 |

Figure 9:
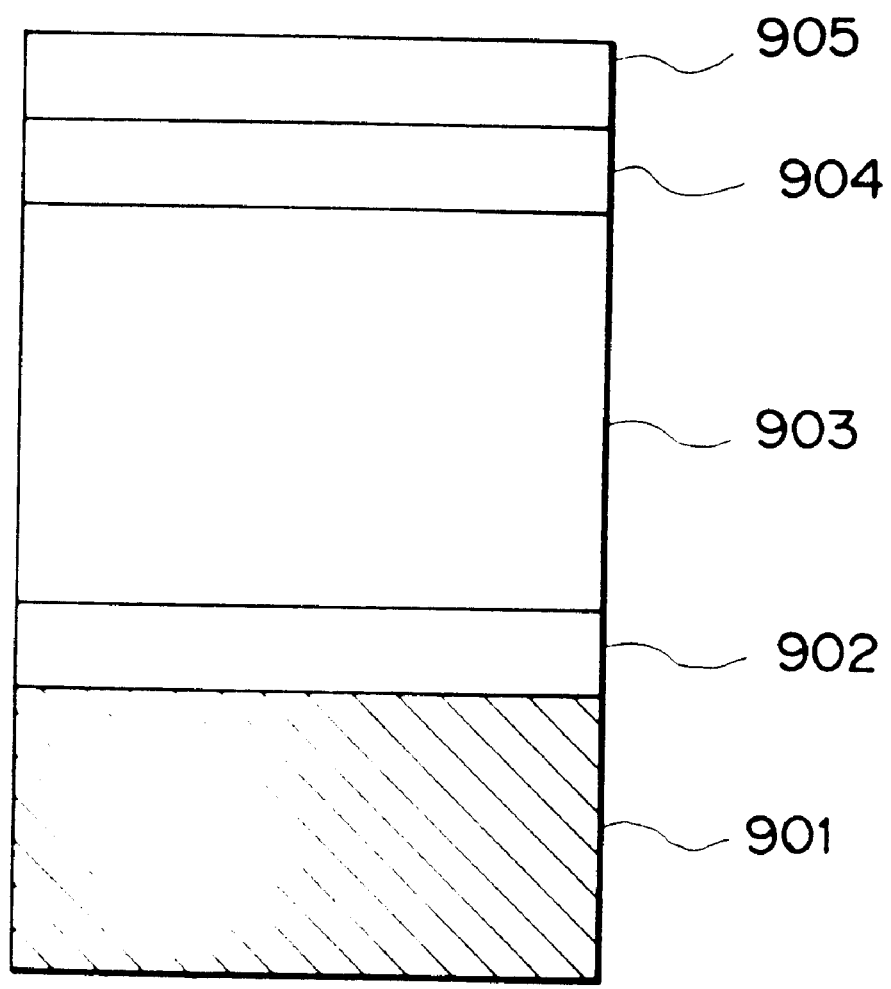
FIG. 9 is a schematic cross-sectional view showing the layer configuration of a photovoltaic element fabricated by carrying out the method of the present invention.

The strip-like substrate having an amorphous silicon multilayer film obtained by the above method deposited thereon was divided into pieces of 9 cm×30 cm in size, and placed within a single chamber vacuum vapor deposition device, and an ITO transparent conductive film was formed thereon under the conditions as indicated by Table 2 to fabricate a photovoltaic element as shown in the schematic cross-sectional view of FIG. 9. In FIG. 9, 901 is a substrate, 902 is an n-type layer, 903 is an i-type layer, 904 is a p-type layer, and 905 is an ITO transparent conductive film.

TABLE 2

| Vapor deposition source (composition ratio) | Vapor deposition atmosphere | Strip heating temperature (°C.) | Vapor deposition rate (Å/s) | Thickness of vapor deposited film (Å) |
| --- | --- | --- | --- | --- |
| In-Sn alloy (50:50) | $O_2$:3 × $10^{-4}$ Torr | 180 | 2 | 700 |

The photovoltaic element thus obtained indicated an excellent photoelectric conversion efficiency equivalent to that of a photovoltaic element as fabricated by a deposited film forming apparatus of three chamber isolation type in which each film forming chamber is completely isolated by a gate valve. Also, measurement of the distribution of impurities in the film thickness direction by secondary ion mass spectrometry (SIMS) showed that no mixture of n-layer P atoms and p-layer B atoms into the i-layer was observed, so that the film forming gases in adjacent film forming chambers could be substantially completely separated via the gas gate.

Comparative example 1

A photovoltaic element was fabricated by continuously forming n-, i-, and p-type amorphous silicon films on a strip-like substrate in the same way as in example 1, except that the position of introducing the scavenging gas into the gas gate connecting the i-type layer film forming chambers and the n- or p-type layer film forming chamber was set at the center of the gas gate. At this point, the pressure of each chamber was 0.500 Torr at 704, 0.500 Torr at 701, 0.005 Torr at 702, 0.500 Torr at 703, and 0.500 Torr at 705, i.e. with a pressure difference between the film forming chambers 701, 702, and between the film forming chambers 702, 703. While introducing the scavenging gas, the measurement of the pressure in the separation passage within the gas gate connecting the film forming chambers, using a pressure gauge 716 provided at the scavenging gas introducing position, showed that the pressure at the scavenging gas introducing position was each 0.450 Torr, which was lower than the pressure at the apertures of the n- and p-type layer film forming chambers 701, 703, or 0.500 Torr.

The measurement of the photoelectric conversion efficiency of the photovoltaic element thus obtained showed only an efficiency of about 60% relative to that of example 1. Also, the measurement of the distribution of impurities in the film thickness direction by secondary ion mass spectrometry (SIMS) showed that mixture of n-layer P atoms and p-layer B atoms into the i-layer occurred.

EXAMPLE 2

A photovoltaic element was fabricated by continuously forming n-, i-, and p-type amorphous silicon films on a strip-like substrate in the same way as in example 1, except that the scavenging gas was $H_2$, instead of Ar, and the amount of scavenging gas introduced was 1000 sccm. At this point, the pressure of each chamber was 0.500 Torr at 704, 0.500 Torr at 701, 0.005 Torr at 702, 0.500 Torr at 703, and 0.500 Torr at 705, i.e. with a pressure difference between the film forming chambers 701, 702, and between the film forming chambers 702, 703. While introducing the scavenging gas, the measurement of the pressure in the separation passage within the gas gate connecting the film forming chambers, using a pressure gauge provided at the scavenging gas introducing position, showed that the pressure at the scavenging gas introducing position was each 0.510 Torr, which was higher than the pressure at the apertures of each film forming chamber 701, 703 of the n- or p-type layer, or 0.500 Torr.

The photovoltaic element thus obtained indicated an excellent photoelectric conversion efficiency equivalent to that of a photovoltaic element as fabricated by a deposited film forming apparatus of three chamber isolation type in which each film forming chamber is completely isolated by a gate valve. The measurement of the distribution of impurities in the film thickness direction by secondary ion mass spectrometry (SIMS) showed that no mixture of n-layer P atoms and p-layer B atoms into the i-layer was observed, so that the film forming gases in adjacent film forming chambers could be substantially completely separated via the gas gate.

Comparative example 2

A photovoltaic element was fabricated by continuously forming n-, i-, and p-type amorphous silicon films on a strip-like substrate in the same way as in example 2, except that the position of introducing the scavenging gas into the gas gate connecting the i-type layer film forming chamber and the n- and p-type layer film forming chambers was set at the center of the gas gate.

At this point, the pressure of each chamber was 0.500 Torr at 704, 0.500 Torr at 701, 0.005 Torr at 702, 0.500 torr at 703, and 0.500 torr at 705, i.e. with pressure difference between the film forming chambers 701, 702, and between the film forming chambers 702, 703. While introducing the scavenging gas, the measurement of the pressure in the separation passage within the gas gate connecting the film forming chambers, using a pressure gauge 716 provided at the scavenging gas introducing position, showed that the pressure at the scavenging gas introducing position was each 0.440 Torr, which was lower than the pressure at the apertures of the n- and p-type layer film forming chambers 701, 703, or 0.500 Torr.

The measurement of the photoelectric conversion efficiency of the photovoltaic element thus obtained showed only an efficiency of about 60% relative to that of example 2.

Also, the measurement of the distribution of impurities in the film thickness direction by secondary ion mass spectrometry (SIMS) showed that mixture of n-layer P atoms and p-layer B atoms into the i-layer occurred.

EXAMPLE 3

Using an apparatus as shown in FIG. 8, amorphous silicon films of n-, i-, and p-type conductive layers were continuously formed on a strip-like substrate by the method of the present invention, according to the following procedure.

First, a strip-like stainless steel substrate 807 having a width of 30 cm, 50 m long and 0.2 mm thick, was delivered from a supply chamber 804, passing through three film forming chambers 801, 802, 803, and taken up in a takeup chamber 805. The separation passage of the gas gates connecting each film forming chamber was 3 mm in height, 40 cm in length, and 31 cm in width.

Next, after each vacuum chamber was evacuated sufficiently through exhaust tubes 811, 815, a respective film forming gas was introduced through a gas introducing tube 810 into each film forming chamber while further evacuating the vacuum chamber, and the rate of exhaust was regulated by checking a pressure gauge 816 so that each film forming chamber was set at a predetermined pressure. He scavenging gas was introduced equally into the upper and lower portions of the gas gate 500 sccm. The scavenging gas introducing tube 814 was disposed at a position of the distance ratio of 1:3, closer to the n- or p- type layer film forming chamber, for the gas gates connecting the i-type layer film forming chamber and the n-type or p-type layer film forming chamber, and at the center of the gas gate for the other gas gates.

At this point, the pressure of each chamber was 0.750 Torr at 804, 0.750 Torr at 801, 0.300 Torr at 802, 0.750 Torr at 803, and 0.750 Torr at 805, i.e. with a pressure difference between the film forming chambers 801, 802, and between the film forming chambers 802, 803. While introducing the scavenging gas, the measurement of the pressure in the separation passage within the gas gate connecting the film forming chambers, using a pressure gauge provided at the scavenging gas introducing position, showed that the pressure at the scavenging gas introducing position between the film forming chambers 801, 802 and between 802, 803 was each 0.760 Torr, which was higher than the pressure at the apertures of each film forming chamber, i.e., 0.750 Torr and 0.300 Torr, whereby it confirmed that the pressure of the separation passage of the gas gates was at a maximum at the scavenging gas introducing position.

The strip-like substrate 807 was heated from the back side thereof by heaters 809 up to a predetermined temperature, plasma discharge was excited within each film forming chamber by introducing RF power from a discharge electrode 812 to continuously form amorphous silicon films of n-, i-, and p-type on the strip-like substrate, while conveying the strip-like substrate at a constant speed. The fabrication conditions within each film forming chamber are listed in Table 3.

TABLE 3

| Film forming chamber | Layer thickness of deposited film (Å) | Gas flow (sccm) | Pressure (Torr) | Discharge power (W) | Heating temperature (°C.) | Deposition rate (Å/s) |
| --- | --- | --- | --- | --- | --- | --- |
| 701 | n-type a-morphous silicon (200) | SiH$_4$:50 PH$_3$:0.5 H$_2$:200 | 0.75 | RF (100) | 350 | 2 |
| 702 | i-type a-morphous silicon (4000) | SiH$_4$:400 H$_2$:1000 | 0.3 | RF (800) | 350 | 20 |
| 703 | p-type a-morphous silicon (100) | SiH$_4$:50 B$_2$H$_6$:0.5 H$_2$:200 | 0.75 | RF (100) | 300 | 1 |

The strip-like substrate having the amorphous silicon film deposited thereon by the above method was divided into pieces of 9 cm×30 cm in size, and placed within a single chamber vacuum vapor deposition device and an ITO transparent conductive film was deposited thereon under the conditions as indicated by Table 2 to fabricate a photovoltaic element as shown in the schematic cross-sectional view of FIG. 9.

The photovoltaic element thus obtained indicated an excellent photoelectric conversion efficiency equivalent to that of a photovoltaic element as fabricated by a deposited film forming apparatus of three chamber isolation type in which each film forming chamber is completely isolated by a gate valve. Also, the measurement of the distribution of impurities in the film thickness direction by secondary ion mass spectrometry (SIMS) showed that no mixture of n-layer P atoms and p-layer B atoms into the i-layer occurred, so that film forming gases in the adjacent film forming chambers could be substantially complete separated via the gas gate.

As above described, with the continuous forming method and apparatus for functional deposited films according to the present invention, a plurality of processes having quite different pressures suitable for the film formation can be incorporated into a series of roll-to-roll methods without any mutual mixture of gases between adjacent film forming chambers, so that it is possible to achieve the continuous formation of functional deposited films with high producibility.

What is claimed is:

1. A film deposition apparatus comprising a plurality of film forming chambers, a gas gate having a slitted separation passage connecting each of said plurality of film forming chambers, conveying means for continuously moving a strip substrate in a longitudinal direction to pass through said plurality of film forming chambers and said gas gates, gas introducing means for introducing a scavenging gas into each said gas gate, and depositing means for depositing said film on said strip substrate within each of said plurality of film forming chambers;

wherein said plurality of film forming chambers are comprised of a film forming chamber for forming a substantially intrinsic semiconductor layer and a film forming chamber for forming a p- or an n-type semiconductor layer, said film forming chamber for forming the substantially intrinsic semiconductor layer being maintained at a lower pressure than said film forming chamber for the p- or n-type semiconductor layer;

wherein the introducing position of said scavenging gas is provided at a position off from the center of the separation passage of said gas gate between the film forming chambers and further from a side of said film forming chamber for forming the intrinsic semiconductor layer, wherein the ratio of the distance from the scavenging gas introducing position to the film forming chamber having the higher pressure relative to the total length of the gas gate in the substrate conveying direction is from 0.1 to 0.4; and wherein the scavenging gas is introduced at a higher pressure than the pressure in either of the connected film forming chambers, further comprising means for maintaining the pressure difference between said higher pressure and said lower pressure film forming chamber at 0.1 Torr to 1.1 Torr.

2. A film deposition apparatus according to claim 1, wherein said depositing means within each film forming chamber employs a method selected from the group consisting of RF plasma CVD, microwave plasma CVD, thermal CVD, MOCVD, MBE, vacuum vapor deposition, and electron beam vapor deposition.

3. A film deposition apparatus according to claim 1, further comprising means for forming a photovoltaic element as a deposited film.

4. A film deposition apparatus according to claim 1, wherein a scavenging gas introducing tube connects said gas gate and one or more film forming chambers adjacent to said gas gate.

5. A film forming apparatus according to claim 1, wherein said gas gate has no exhaust means.

6. A film forming apparatus comprising:

a film forming chamber for forming a substantially intrinsic semiconductor layer at a higher pressure;

a film forming chamber for forming a p- or an n-type semiconductor layer at a lower pressure than used in forming said substantially intrinsic layer;

a gas gate having a slitted separation passage which connects said lower-pressure film forming chamber for forming said p- or n-type semiconductor layer and said higher pressure film forming chamber for forming said substantially intrinsic semiconductor layer;

conveying means capable of continuously moving a strip substrate in a direction wherein the substrate passes through each of said film-forming chambers and said gas gate; and a scavenging gas means for introducing a scavenging gas is provided at a position off from the center of said separation passage of said gas gate between the film forming chambers, said scavenging gas introducing means being closer to a side of said film forming chamber for forming said p- or n- type semiconductor layer, and wherein said scavenging gas introducing means and said scavenging gas are means for maintaining a pressure difference between said film forming chambers at 0.1 to 1.1 Torr, and the ratio of the distance from the scavenging gas introducing position to the film forming chamber having the higher pressure relative to the total length of said gas gate in the substrate conveying direction is from 0.1 to 0.4.

7. A film forming apparatus according to claim 6, further comprising depositing means in each of said film forming chambers wherein said depositing means in each of said film forming chambers employs a method selected from the group consisting of RF plasma CVD, microwave plasma CVD, sputtering, ion plating, photo assisted CVD, thermal CVD, MOCVD, MBE, vacuum CVD, and electron beam vapor deposition.

8. A film deposition apparatus according to claim 6, wherein a scavenging gas introducing tube connects said gas gate and one or more film forming chambers adjacent to said gas gate.

9. A film forming apparatus according to claim 6, wherein said gas gate has no exhaust means.

10. A film deposition apparatus comprising:

at least two film forming chambers for depositing a first semiconductor layer on a strip substrate utilizing a microwave in one of the film forming chambers and for depositing a second semiconductor layer on the same strip substrate in another of the film forming chambers utilizing an RF wave, wherein the pressure of one chamber is higher than the other chamber;

a gas introducing system connected to said film forming chambers for introducing a raw material gas into each of said film forming chambers;

a gas scavenging system connected to said film forming chambers for scavenging the interior of each of said film forming chambers, wherein said gas introducing system and said gas scavenging system are means for maintaining a pressure difference between said film forming chambers at 0.1 to 1.1 Torr;

a gas gate connecting to said film forming chambers having a slitted separation passage through which a the slitted substrate can be passed; and gas introducing means for introducing a scavenging gas into said gas gate;

wherein the introducing portion of the gas introducing means for introducing the scavenging gas is provided at a position off from the center of the operation separation passage of the gas gate between said film forming chambers toward the film forming chamber for depositing the second semiconductor layer, and the ratio of the distance from the scavenging gas introducing position to the film forming chamber having the higher pressure relative to a total length of said gas gate in a substrate conveying direction is from 0.1 to 0.4.

11. A film deposition apparatus according to claim 10, wherein at least a portion of said gas introducing system connected to said film forming chamber utilizing the RF wave is used to supply impurities which can control conductivity of a semiconductor.

12. A film deposition apparatus according to claim 10, wherein said first semiconductor layer is a substantially intrinsic semiconductor layer.

13. A deposited film deposition apparatus according to claim 10, wherein said second semiconductor layer is a p or n type semiconductor layer.

14. A film deposition apparatus according to claim 10, wherein a scavenging gas introducing tube connects said gas gate and one or more film forming chambers adjacent to said gas gate.

15. A film forming apparatus according to claim 10, wherein said gas gate has no exhaust means.

* * * * *

UNITED STATES PATENT AND TRADEMARK OFFICE
CERTIFICATE OF CORRECTION

PATENT NO. : 5,968,274
DATED : October 19, 1999
INVENTOR(S) : Yasushi Fujioka et al.

It is certified that error appears in the above-identified patent and that said Letters Patent is hereby corrected as shown below:

Title page
Under Column [75], Inventors, "Akira Sakai; Tadashi Hori, Both of Soraku-gun," should read -- Akira Sakai, Soraku-gun; Tadashi Hori, Tsuzuki-gun, --.

Column 2,
Line 20, "chamber" should read -- chambers --;
Line 22, "chamber, should read -- chambers, --;
Line 24, "that" should read -- in that --;
Line 39, "chamber (i.e.," should read -- chambers (i.e., --;
Line 47, "chamber," should read -- chambers, --.

Column 3,
Line 4, "at" should be deleted;
Line 11, "to" should read -- to satisfy --.

Column 6,
Line 50, "higher a" should read -- a higher --.

Column 7,
Line 24, "higher the" should read -- a higher --.

Column 8,
Line 13, "is high" should read -- is higher --.

Column 9,
Line 3, "was" should be deleted;
Line 57, "chamber." should read -- chambers. --.

Column 10,
Line 26, "then" should read -- than --;
Line 57, "(Where" should read -- (where --.

Column 12,
Line 1, "into mixed" should read -- mixed into --;
Line 43, "BlH$_3$," should read -- BiH$_3$, --.

UNITED STATES PATENT AND TRADEMARK OFFICE
CERTIFICATE OF CORRECTION

PATENT NO. : 5,968,274
DATED : October 19, 1999
INVENTOR(S) : Yasushi Fujioka et al.

It is certified that error appears in the above-identified patent and that said Letters Patent is hereby corrected as shown below:

Column 14,
Line 9, "of the" should read -- for the --;

Column 18,
Line 4, "complete" should read -- completely --.

Column 20,
Line 13, "a the" should read -- the --;
Line 15, "slitted" should read -- strip --.

Signed and Sealed this

Eighteenth Day of September, 2001

*Attest:*

NICHOLAS P. GODICI
*Attesting Officer*     Acting Director of the United States Patent and Trademark Office